(12) United States Patent
Ivannikov et al.

(10) Patent No.: US 7,528,596 B2
(45) Date of Patent: May 5, 2009

(54) FIXTURE FOR MANUAL FUNCTIONAL TESTING OF WIRELESS DEVICES

(75) Inventors: Arkady Ivannikov, Mississauga (CA); Alexander Koch, Kitchener (CA); Marek Reksnis, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 0 days.

(21) Appl. No.: 11/762,420

(22) Filed: Jun. 13, 2007

(65) Prior Publication Data

US 2007/0236871 A1 Oct. 11, 2007

Related U.S. Application Data

(63) Continuation of application No. 11/072,224, filed on Mar. 7, 2005, now Pat. No. 7,245,119.

(51) Int. Cl.
*G01R 31/28* (2006.01)
*H04W 24/00* (2009.01)

(52) U.S. Cl. ............... 324/158.1; 455/423; 455/425

(58) Field of Classification Search ............. 324/73.1, 324/158.1, 537–538, 754–755, 761–762; 455/67.11, 67.14, 90.3, 222.1, 344, 349, 455/425, 550.1, 553.1; 361/686, 679; 379/433.01; 439/157

See application file for complete search history.

(56) References Cited

U.S. PATENT DOCUMENTS

| | | | | |
|---|---|---|---|---|
| 5,201,063 A | * | 4/1993 | Tam et al. ............. | 455/67.11 |
| 5,875,398 A | * | 2/1999 | Snapp ...................... | 455/424 |
| 6,223,033 B1 | * | 4/2001 | Lusterman ............... | 455/425 |
| 6,290,534 B1 | * | 9/2001 | Sadler ..................... | 439/534 |
| 6,309,230 B2 | * | 10/2001 | Helot ....................... | 439/131 |
| 7,081,869 B2 | * | 7/2006 | Sommerfeld et al. .... | 343/906 |
| 2002/0107043 A1 | * | 8/2002 | Adamson et al. ........ | 455/550 |
| 2004/0203489 A1 | * | 10/2004 | Comerford et al. ...... | 455/90.1 |
| 2004/0226167 A1 | * | 11/2004 | Tseng et al. .............. | 29/729 |
| 2004/0261248 A1 | * | 12/2004 | Hwang .................... | 29/559 |

FOREIGN PATENT DOCUMENTS

EP 0 344 988 12/1989

OTHER PUBLICATIONS

Patent Abstracts of Japan, vol. 2003, No. 06, Jun. 3, 2003 and JP 2003 060587A (Denso Corp), Feb. 28, 2003.
European Search and Examination report for European Patent Application No. 05101729.1, mailed Aug. 9, 2005.

* cited by examiner

*Primary Examiner*—Ha Tran T Nguyen
*Assistant Examiner*—Joshua Benitez
(74) *Attorney, Agent, or Firm*—Ogilvy Renault LLP

(57) ABSTRACT

A fixture is provided for functional testing of an assembled wireless device. The wireless device has a first port and a second port. The fixture comprises: a base having an opening formed therein for receiving a retainer, the retainer being rotatably mounted in the opening for rotating from a first position to a second position, the retainer for receiving the wireless device while in the first position; a first connector mounted in the retainer for engaging the first port of the wireless device when the wireless device is received by the retainer in the first position; and a second connector rotatably mounted on the base, the second connector for engaging the second port of the wireless device when the retainer is rotated to the second position.

26 Claims, 15 Drawing Sheets

FIXTURE FOR MANUAL FUNCTIONAL TESTING OF WIRELESS DEVICES

RELATED APPLICATION DATA

This application is a continuation of U.S. patent application Ser. No. 11/072,224, filed Mar. 7, 2005 now U.S. Pat. No 7,245,119.

FIELD OF THE INVENTION

This invention relates to the field of wireless device functional testing, and more specifically, to a fixture for manual functional testing of assembled wireless devices.

BACKGROUND

Current wireless mobile communication devices include microprocessors, memory, soundcards, and run one or more software applications. Examples of software applications used in these wireless devices include micro-browsers, address books, email clients, and wavetable instruments. Additionally, wireless devices have access to a plurality of services via the Internet. A wireless device may, for example, be used to browse web sites on the Internet, to transmit and receive graphics, and to execute streaming audio and/or video applications.

Wireless devices are typically fully tested before being shipped from a manufacturer's factory. This is especially important for the newer generations of wireless devices which have increased functionality as described Once a wireless device is assembled in full plastics, it typically progresses through various test stages to test the function of each of its components. These test stages may include the following: manual testing (e.g., keyboard, buttons, the functions initiated by each, etc.), radio frequency ("RF") testing, electrical and software tests (e.g., charger, vibrator, software applications, display, etc.), audio testing (e.g. internal microphone, internal speaker, buzzer, etc.), environmental testing, etc.

With respect to manual testing, connecting wireless devices to test equipment often requires the use of bulky external fixturing (e.g., "bulls-eye") that may not only hinder access to and portability of the device under test ("DUT"), but may also require the partial disassembly of the DUT which in turn may compromise the integrity of the DUT.

A need therefore exists for the efficient functional testing of assembled wireless devices. Accordingly, a solution that addresses, at least in part, the above and other shortcomings is desired.

BRIEF DESCRIPTION OF THE DRAWINGS

Further features and advantages of the embodiments of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENTS

According to one aspect of the present disclosure, there is provided a fixture for functional testing of an assembled wireless device. The wireless device has a first port and a second port. The fixture comprises a base having an opening formed therein for receiving a retainer, the retainer being rotatably mounted in the opening for rotating from a first position to a second position, the retainer for receiving the wireless device while in the first position; a first connector mounted in the retainer for engaging the first port of the wireless device when the wireless device is received by the retainer in the first position; and a second connector rotatably mounted on the base. The second connector is for engaging the second port of the wireless device when the retainer is rotated to the second position.

According to another aspect of the present disclosure, there is provided a method for functional testing of an assembled wireless device. The wireless device has a first port and a second port. The method comprises providing a fixture having: a base having an opening formed therein for receiving a retainer, the retainer being rotatably mounted in the opening for rotating from a first position to a second position, the retainer for receiving the wireless device while in the first position; a first connector mounted in the retainer for engaging the first port of the wireless device when the wireless device is received by the retainer in the first position; and a second connector rotatably mounted on the base, the second connector for engaging the second port of the wireless device when the retainer is rotated to the second position; and applying test signals to at least one of the first connector and the second connector.

Figure 1:
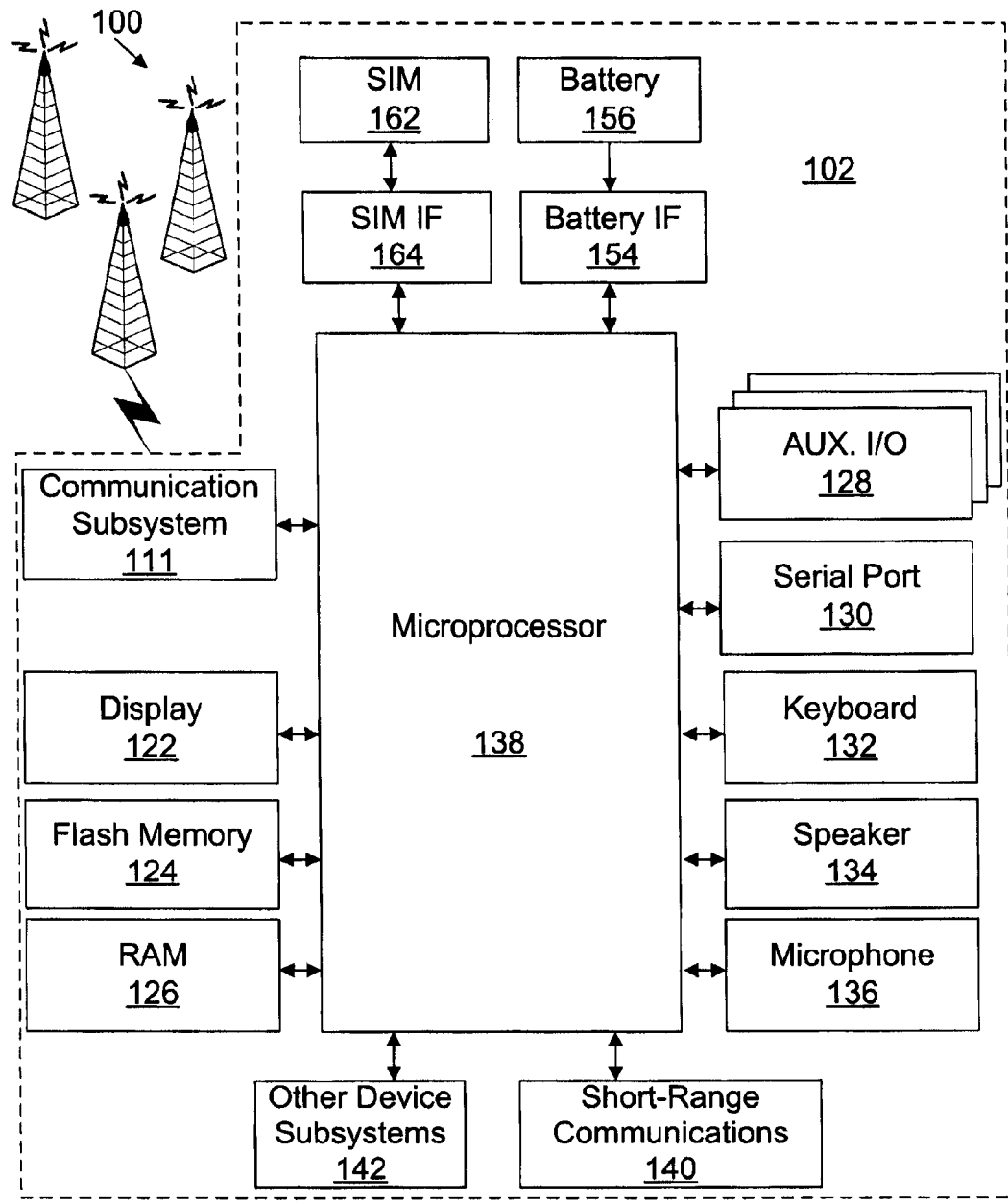
FIG. 1 is a block diagram illustrating a wireless device adapted in accordance with an embodiment of the invention.

FIG. 1 is a block diagram illustrating a wireless device 102 adapted in accordance with an embodiment of the invention. Typically, the wireless device 102 is a handheld device 102. The wireless device 102 is a two-way communication device having at least voice and advanced data communication capabilities, including the capability to communicate with other computer systems. Depending on the functionality provided by the device 102, it may be referred to as a data messaging device, a two-way pager, a cellular telephone with data messaging capabilities, a wireless Internet appliance, or a data communication device (with or without telephony capabilities). The device 102 may communication with any one of a plurality of fixed transceiver stations 100 within its geographic coverage area.

The wireless device 102 will normally incorporate a communication subsystem 111, which includes a RF receiver, a RF transmitter, and associated components, such as one or more (preferably embedded or internal) antenna elements and, local oscillators ("LOs"), and a processing module such as a digital signal processor ("DSP") (all not shown). As will be apparent to those skilled in field of communications, particular design of the communication subsystem 111 depends on the communication network 100 in which the device 102 is intended to operate.

Network access is associated with a subscriber or user of the device 102 and therefore the device 102 requires a Subscriber Identity module (or "SIM" card) 162 to be inserted in a SIM interface ("IF") 164 in order to operate in the network. The device 102 is a battery-powered device so it also includes a battery IF 154 for receiving one or more rechargeable batteries 156. Such a battery 156 provides electrical power to most if not all electrical circuitry in the device 102, and the battery IF 154 provides for a mechanical and electrical connection for it. The battery IF 154 is coupled to a regulator (not shown) which provides power to the circuitry of the device 102.

The wireless device 102 includes a microprocessor (or central processing system ("CPU")) 138 which controls overall operation of the device 102. Communication functions, including at least data and voice communications, are performed through the communication subsystem 111. The microprocessor 138 also interacts with additional device subsystems such as a display 122, a flash memory 124 or other persistent store, a random access memory ("RAM") 126, auxiliary input/output ("I/O") subsystems 128, a serial port 130, a keyboard 132, a speaker 134, a microphone 136, a short-range communications subsystem 140, and any other device subsystems generally designated at 142. Some of the subsystems shown in FIG. 2 perform communication-related functions, whereas other subsystems may provide "resident" or on-device functions. Notably, some subsystems, such as the keyboard 132 and display 122, for example, may be used for both communication-related functions, such as entering a text message for transmission over a communication network, and device-resident functions such as a calculator or task list. Operating system software used by the microprocessor 138 is preferably stored in a persistent store such as the flash memory 124, which may alternatively be a read-only memory ("ROM") or similar storage element (not shown). Those skilled in the art will appreciate that the operating system, specific device applications, or parts thereof, may be temporarily loaded into a volatile store such as RAM 126.

The microprocessor 138, in addition to its operating system functions, preferably enables execution or software applications on the device 102. A predetermined set of applications which control basic device operations, including at least data and voice communication applications, will normally be installed on the device 102 during its manufacture. A preferred application that may be loaded onto the device 102 may be a personal information manager ("PIM") application having the ability to organize and manage data items relating to the user such as, but not limited to, instant messaging ("IM"), email, calendar events, voice mails, appointments, and task items. Naturally, one or more memory stores are available on the device 102 and SIM 162 to facilitate storage of PIM data items and other information.

The PIM application preferably has the ability to send and receive data items via the wireless network 100. In a preferred embodiment, PIM data items are seamlessly integrated, synchronized, and updated via the wireless network 100, with the user's corresponding data items stored and/or associated with a host computer system (not shown) thereby creating a mirrored host computer on the device 102 with respect to such items. This is especially advantageous where the host computer system is the user's office computer system (not shown). Additional applications may also be loaded onto the device 102 through the network 100, an auxiliary I/O subsystem 128, serial port 130, short-range communications subsystem 140, or any other suitable subsystem 142, and installed by a user in RAM 126 or preferably in a non-volatile store (e.g., flash memory 124) for execution by the microprocessor 138. Such flexibility in application installation increases the functionality of the device 102 and may provide enhanced on-device functions, communication-related functions, or both. For example, secure communication applications may enable electronic commerce functions and other such financial transactions to be performed using the wireless device 102.

In a data communication mode, a received signal such as a text message, an email message, or web page download will be processed by the communication subsystem 111 and input to the microprocessor 138. The microprocessor 138 will preferably further process the signal for output to the display 122 and/or to the auxiliary I/O device 128. A user of the wireless device 102 may also compose data items, such as email messages, for example, using the keyboard 132 in conjunction with the display 122 and possibly the auxiliary I/O device 128. These composed items may be transmitted over a communication network 100 through the communication subsystem 111 or the short range communication subsystem 140.

The keyboard 132 is preferably a complete alphanumeric keyboard and/or telephone-type keypad. For example, according to one embodiment of the invention the keyboard 132 is a QWERTY keyboard including a full set of keys or buttons corresponding to those on a standard English computer keyboard or typewriter. Alternatively, the keyboard 132 may be a modified QWERTY keyboard including a modified arrangement or subset of the QWERTY keyboard. Alternatively, the keyboard 132 may be a Dvorak keyboard or modified Dvorak keyboard. Unlike a QWERTY keyboard, the Dvorak keyboard is designed so that the middle row of keys includes the most common letters. In addition, common letter combinations are positioned in such a way that they can be typed quickly.

According to another embodiment of the invention, the keyboard 132 may be a combination of a telephone style keypad and QWERTY style keyboard. For example, the keyboard 132 may have a 5×5 array of keys or buttons on which, unlike a traditional telephone layout that has letters overlaid on numbers in alphabetical order for text entry, the overlay for the keyboard may be in QWERTY order. Advantageously, the keyboard 132 allows users to quickly and accurately dial or type either using single-handed operation or two-handed thumb-typing without the limitations associated with traditional telephone keypads. For example, the user need not learn a new way to type.

In addition, the keyboard 132 may be a predictive text keyboard having associated with it a predictive text software module 206 that allows QWERTY style typing, using a built-in dictionary and set of rules, to select the correct letter based on context. To help facilitate easy spelling and composition, the predictive text software module 206 includes intuitive software with a word list (e.g., over 30,000 words) and the ability to increase that list based on the frequency of use and the names in the handheld's address book. It also has the ability to recognize character letter sequences that are common in the English language, such as "-ing". Advantageously, as the software 206 "understands" what a user is typing, the user can concentrate on composing his or her message rather than on the input method.

For voice communications, the overall operation of the wireless device 102 is substantially similar, except that the received signals would be output to the speaker 134 and signals for transmillion would be generated by the microphone 136. Alternative voice or audio I/O subsystems, such as a voice message recording subsystem, may also be implemented on the device 102. Although voice or audio signal output is preferably accomplished primarily through the speaker 134, the display 122 may also be used to provide, for example, an indication of the identity of a calling party, duration of a voice call, or other voice call related information.

The serial port 130 shown in FIG. 1 is normally implemented in a personal digital assistant ("PDA")-type communication device for which synchronization with a user's desktop computer is a desirable, albeit optional, component. The serial port 130 enables a user to set preferences through an external device or software application and extends the capabilities of the device 102 by providing for information or software downloads to the device 102 other than through a wireless communication network 100. The alternate download path may, for example, be used to load an encryption key onto the device 102 through a direct and thus reliable and trusted connection to thereby provide secure device communication.

The short-range communications subsystem 140 shown in FIG. 1 is an additional optional component which provides for communication between the device 102 and different systems or devices (not shown), which need not necessarily be similar devices. For example, the subsystem 140 may include an infrared device and associated circuits and components, or a Bluetooth™ communication module to provide for communication with similarly-enabled systems and devices. (Bluetooth™ is a registered trademark of Bluetooth SIG, Inc.)

Figure 2:
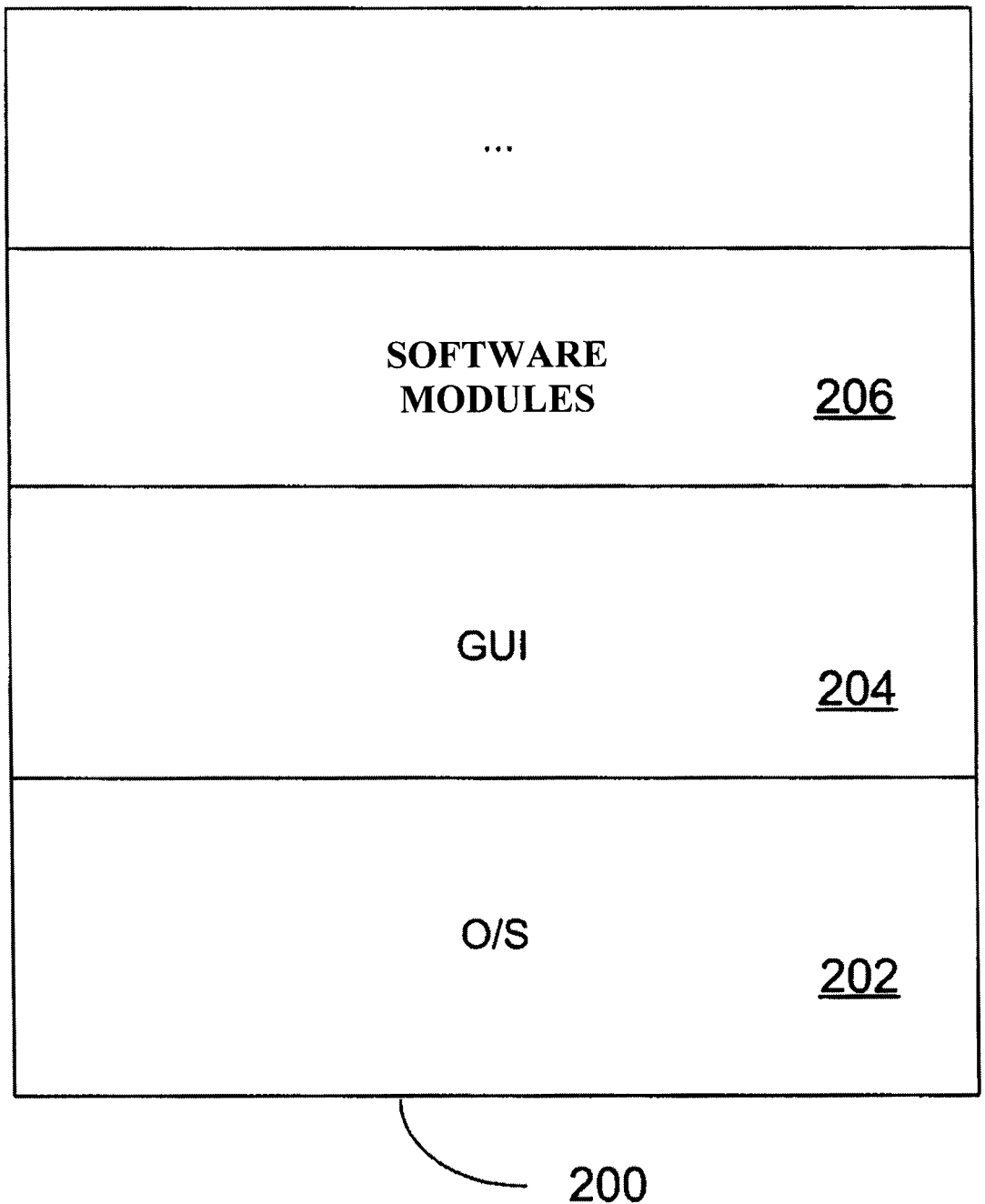
FIG. 2 is a block diagram illustrating a memory of the wireless device of FIG. 1.

FIG. 2 is a block diagram illustrating a memory 200 of the wireless device 102 of FIG. 1. The memory 200 has various software components for controlling the device 102 and may include flash memory 124, RAM 126, or ROM (not shown), for example. In accordance with an embodiment of the invention, the wireless device 102 is intended to be a multi-tasking wireless communications device configured for sending and receiving data items and for making and receiving voice calls. To provide a user-friendly environment to control the operation of the device 102, an operating system ("O/S") 202 resident on the device 102 provides a basic set of operations for supporting various applications typically operable through a graphical user interface ("GUI") 204. For example, the O/S 202 provides basic input/output system features to obtain input from the auxiliary I/O 128, keyboard 132, and the like, and for facilitating output to the user. In accordance with an embodiment of the invention, there are provided software modules 206 for testing of the wireless device as will be described below. Though not shown, one or more applications for managing communications or for providing personal digital assistant like functions may also be included.

Thus, the wireless device 102 includes computer executable programmed instructions for directing the device 102 to implement the embodiments of the present invention. The programmed instructions may be embodied in one or more software modules 206 resident in the memory 200 of the wireless device 102. Alternatively, the programmed instructions may be embodied on a computer readable medium (such as a CD disk or floppy disk) which may be used for transporting the programmed instructions to the memory 200 of the wireless device 102. Alternatively, the programmed instructions may be embedded in a computer-readable, signal-bearing medium that is uploaded to a network by a vendor or supplier of the programmed instructions, and this signal-bearing medium may be downloaded through an interface 111, 130, 140 to the wireless device 102 from the network by end users or potential buyers.

Figure 3:
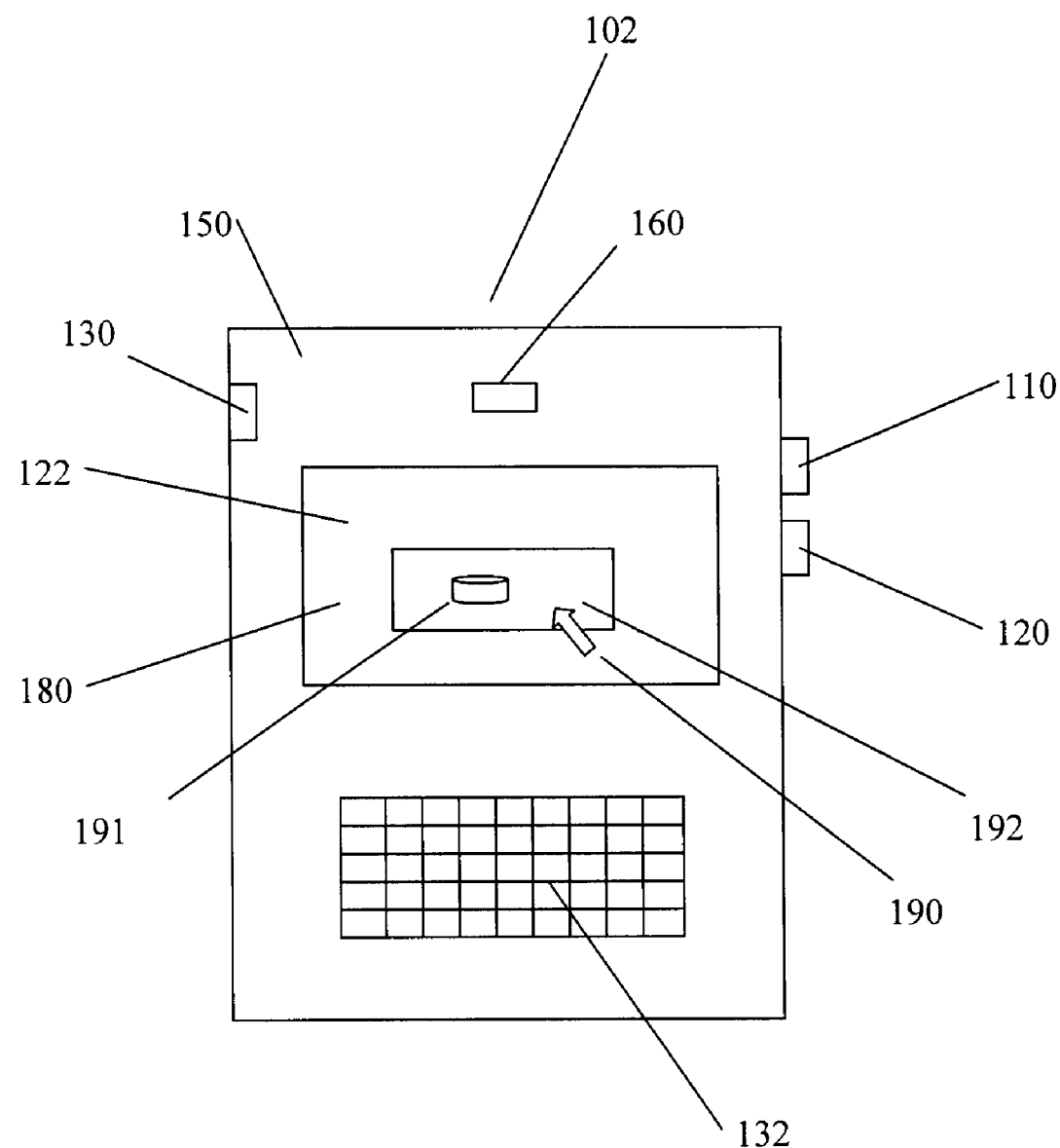
FIG. 3 is a front view illustrating the wireless device of FIG. 1.

FIG. 3 is a front view illustrating the wireless device 102 of FIG. 1. As mentioned above, the wireless device 102 can be a data and voice-enabled handheld device. The wireless device 102 includes a casing 150, a display screen 122, a graphical user interface ("GUI") 180, a keyboard (or keypad) 132, a thumbwheel (or trackwheel) 110, various select buttons 120, and various signal inputs/outputs 160 (e.g., power connector input, microphone, speaker, data interface input, etc.). Internally, the wireless device 102 includes one or more circuit boards, a CPU 138, memory 200, a battery 156, an antenna, etc. (not shown), which are coupled to the signal inputs/outputs 160, keyboard 132, display screen 122, etc.

The microprocessor 138 of the wireless device 102 is typically coupled to one or more devices 110, 120, 132 for receiving user commands or queries and for displaying the results of these commands or queries to the user on the display 122. For example, user queries may be transformed into a combination of commands for producing one or more tables of output data which may be incorporated in one or more display pages for presentation to the user. The microprocessor 138 is coupled to memory 200 for containing software modules 206 and data such as database tables and test parameters. As mentioned, the memory 200 may include a variety of storage devices typically arranged in a hierarchy of storage as understood to those skilled in the art.

A user may interact with the wireless device 102 and its software modules 206 using the graphical user interface ("GUI") 180. GUIs are supported by common operating systems and provide a display format which enables a user to choose commands, execute application programs, manage computer files, and perform other functions by selecting pictorial representations know as icons, or items from a menu through use of an input or pointing device such as a thumbwheel 110 and keyboard 132. In general, a GUI is used to convey information to and receive commands from users and generally includes a variety of GUI objects or controls, including icons, toolbars, drop-down menus, pop-up menus, text, dialog boxes, buttons, and the like. A user typically interacts with a GUI 180 presented on a display 122 by using an input or pointing device (e.g., a thumbwheel 110, a keyboard 132, etc.) to position a pointer or cursor 190 over an object 191 (i.e., by depressing the thumbwheel 110, by depressing a button on the keyboard 132, etc.). This is often referred to as a point-and-click operation or a selection operation. Typically, the object 191 may be hi-lighted (e.g., shaded) when it is pointed at.

Typically, a GUI based system presents application, system status, and other information to the user in "windows" appearing on the display 122. A window 192 is a more or less rectangular area within the display 122 in which a user may view an application or a document. Such a window 192 may be open, closed, displayed full screen, reduced to an icon, increased or reduced in size, or moved to different areas of the display 122. Multiple windows may be displayed simultaneously, such as: windows included within other windows, windows, windows overlapping other windows, or windows tiled within the display area.

Figure 4:
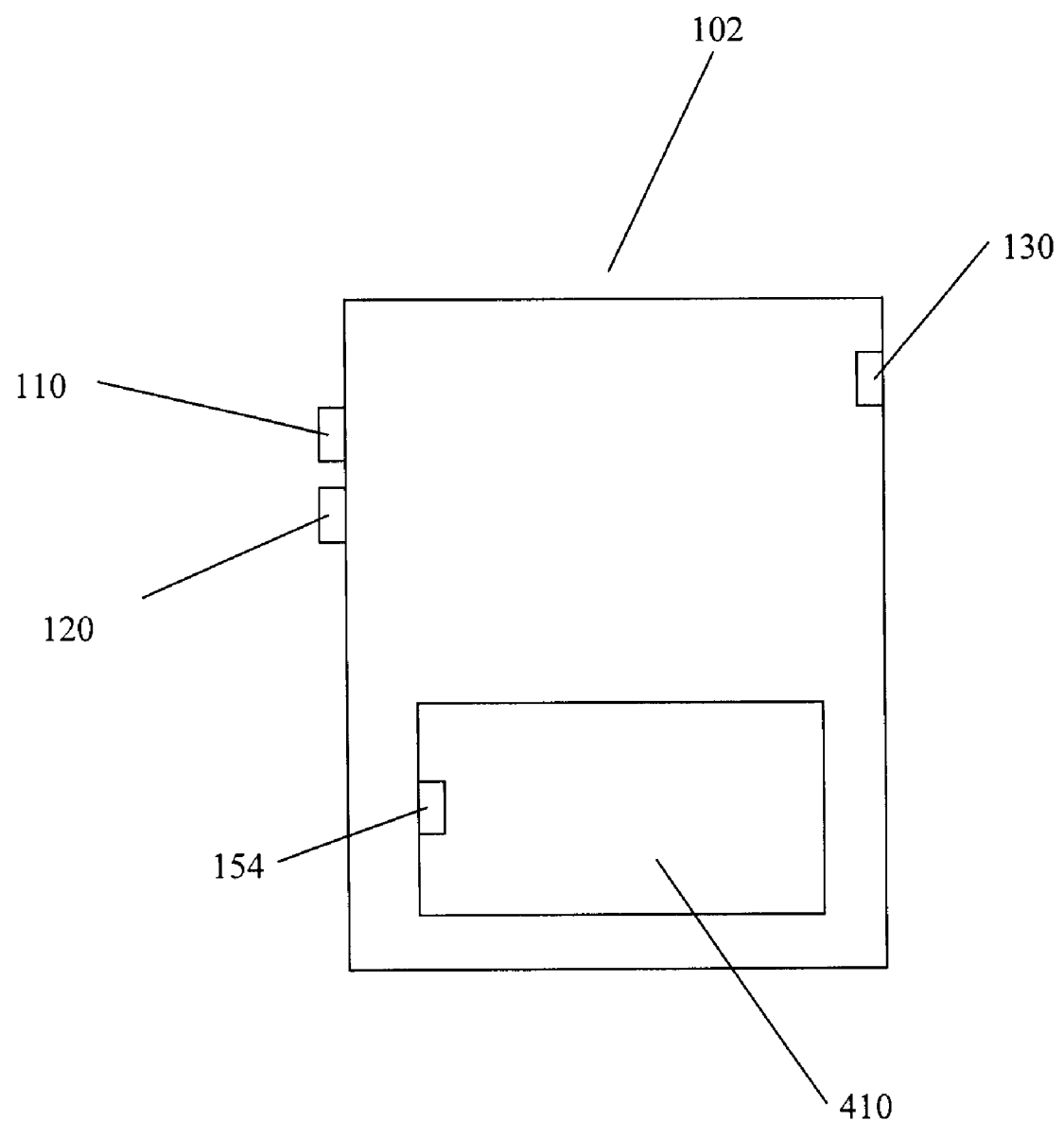
FIG. 4 is a rear view illustrating the wireless device of FIG. 1.

FIG. 4 is a rear view illustrating the wireless device 102 of FIG. 1. The wireless device 102 has a removable rear casing, or portion of casing 410, for concealing a battery cavity (not shown) and battery contacts (i.e., interface) 154 for the battery 156. The battery 156 may be a battery pack including the portion of the casing 410.

Figure 5:
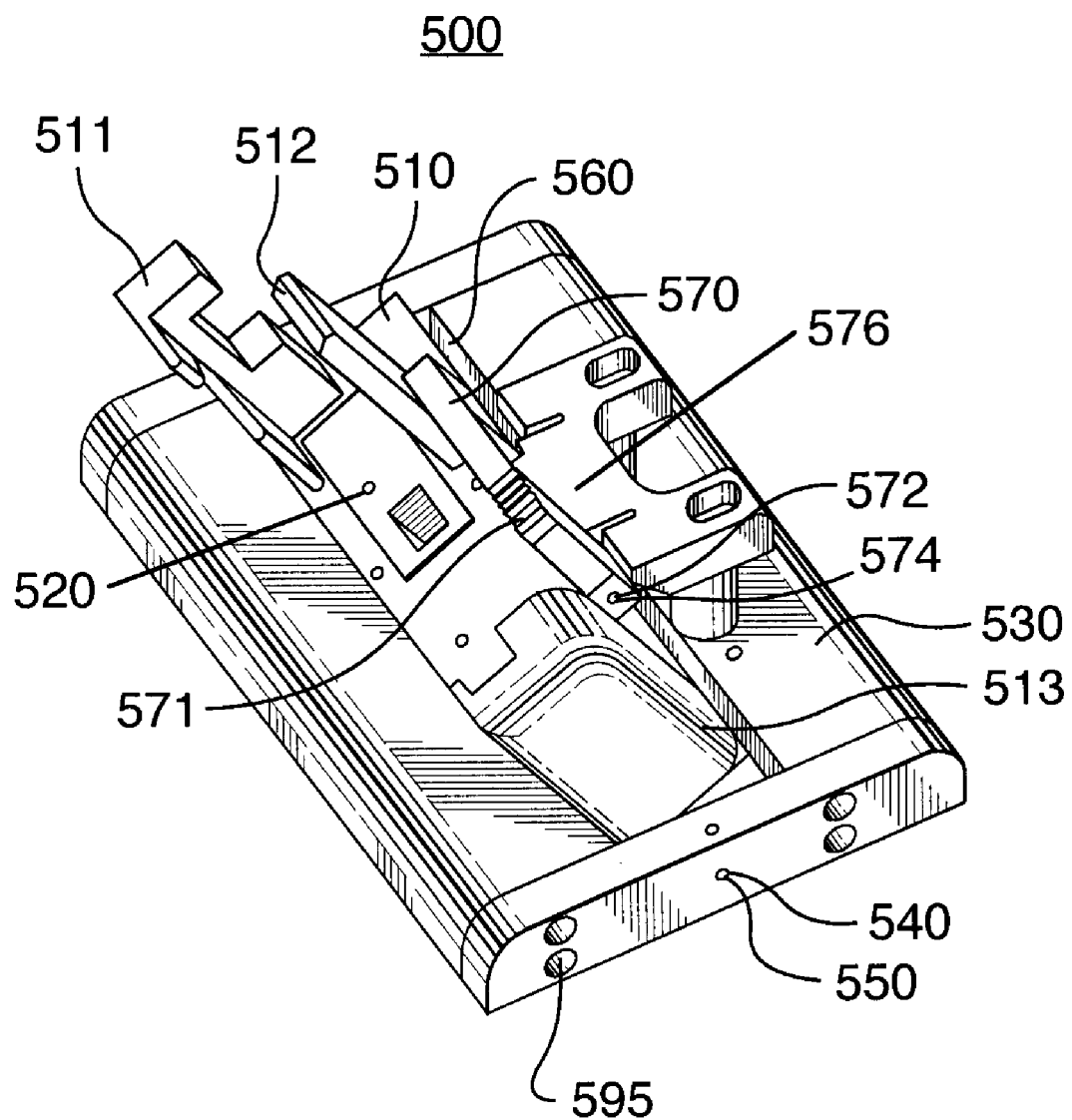
FIG. 5 is a front perspective view illustrating a test fixture for the wireless device in accordance with an embodiment of the invention.

FIG. 5 is a front perspective view illustrating a test fixture 500 for the wireless device 102 in accordance with an embodiment of the invention. The test fixture 500 allows the installed wireless device 102, or device under test ("DUT") 102, to be powered-up through the wireless device's internal battery contacts 154. This is facilitated by installing the DUT 102 in the text fixture 500 with a combination of linear and rotary movements of the DUT 102. Advantageously, the text fixture 500 does not require the use of industry standard pneumatic/electrical drivers at the power-up stage. This results in lower costs for the test fixture 102 and higher mobility within a test station area.

Figure 6:
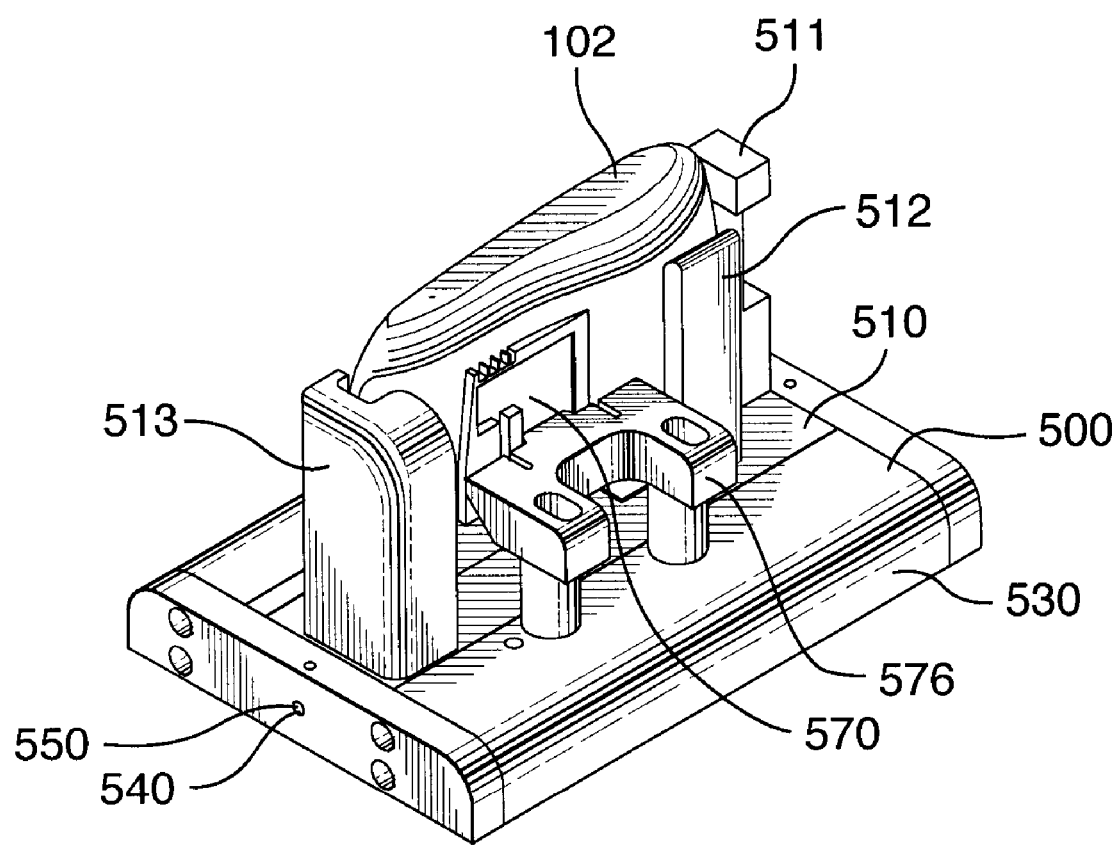
FIG. 6 is a rear perspective view illustrating the test fixture of FIG. 4 with the wireless device installed in accordance with an embodiment of the invention.
Figure 9:
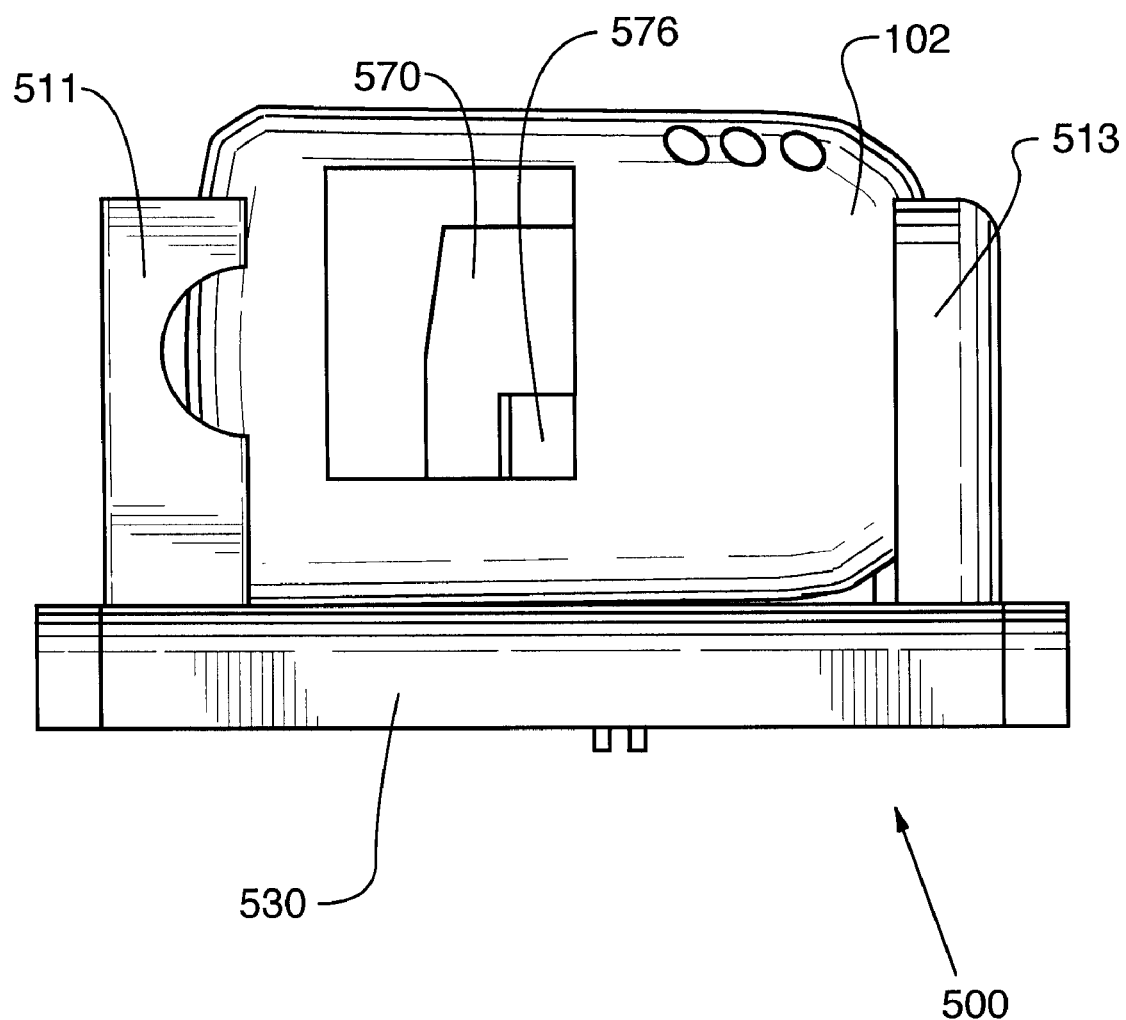
FIG. 9 is a front view illustrating the test fixture of FIG. 4 with the wireless device installed.
Figure 10:
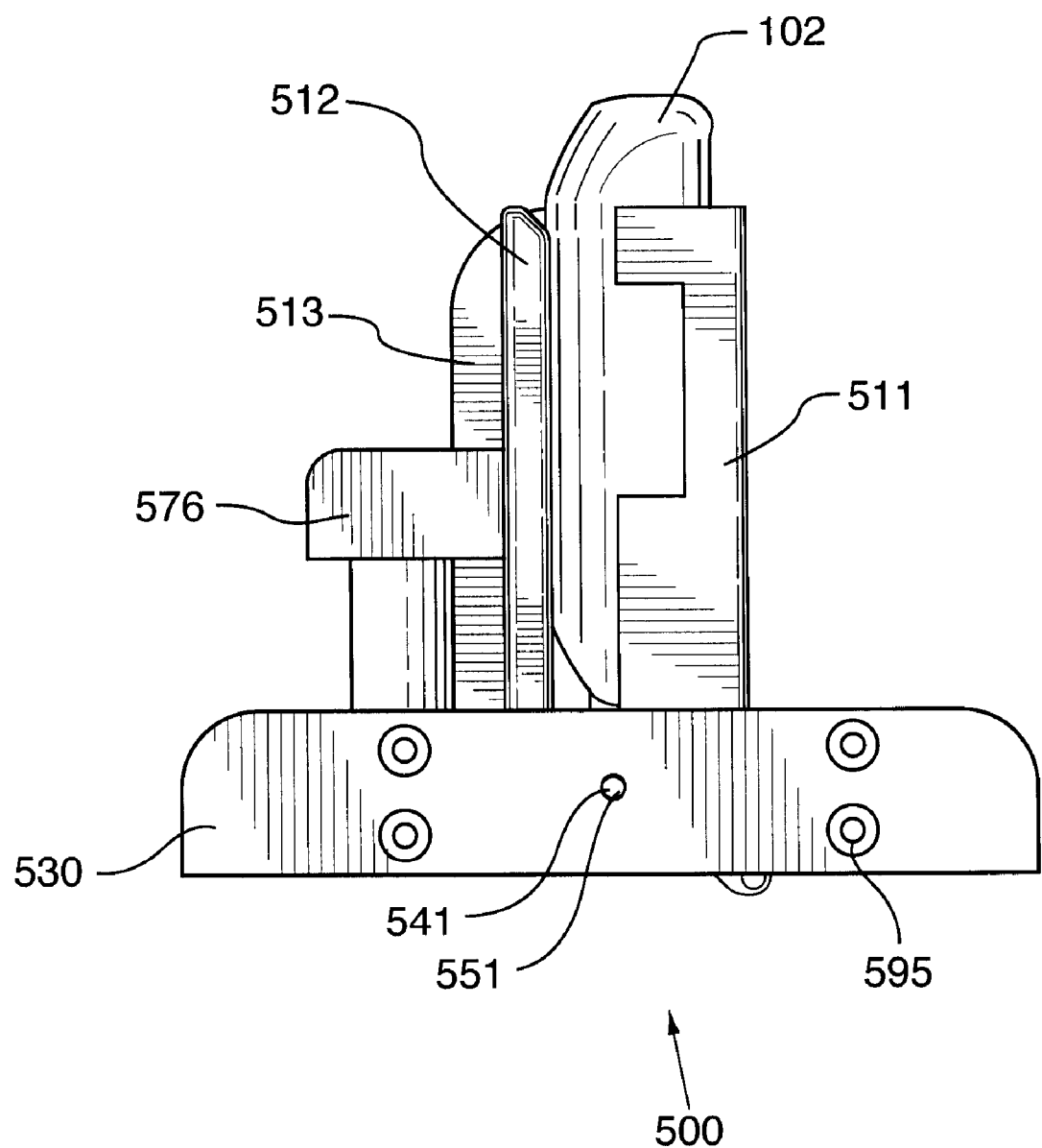
FIG. 10 is a left side view illustrating the test fixture of FIG. 4 with the wireless device installed.
Figure 11:
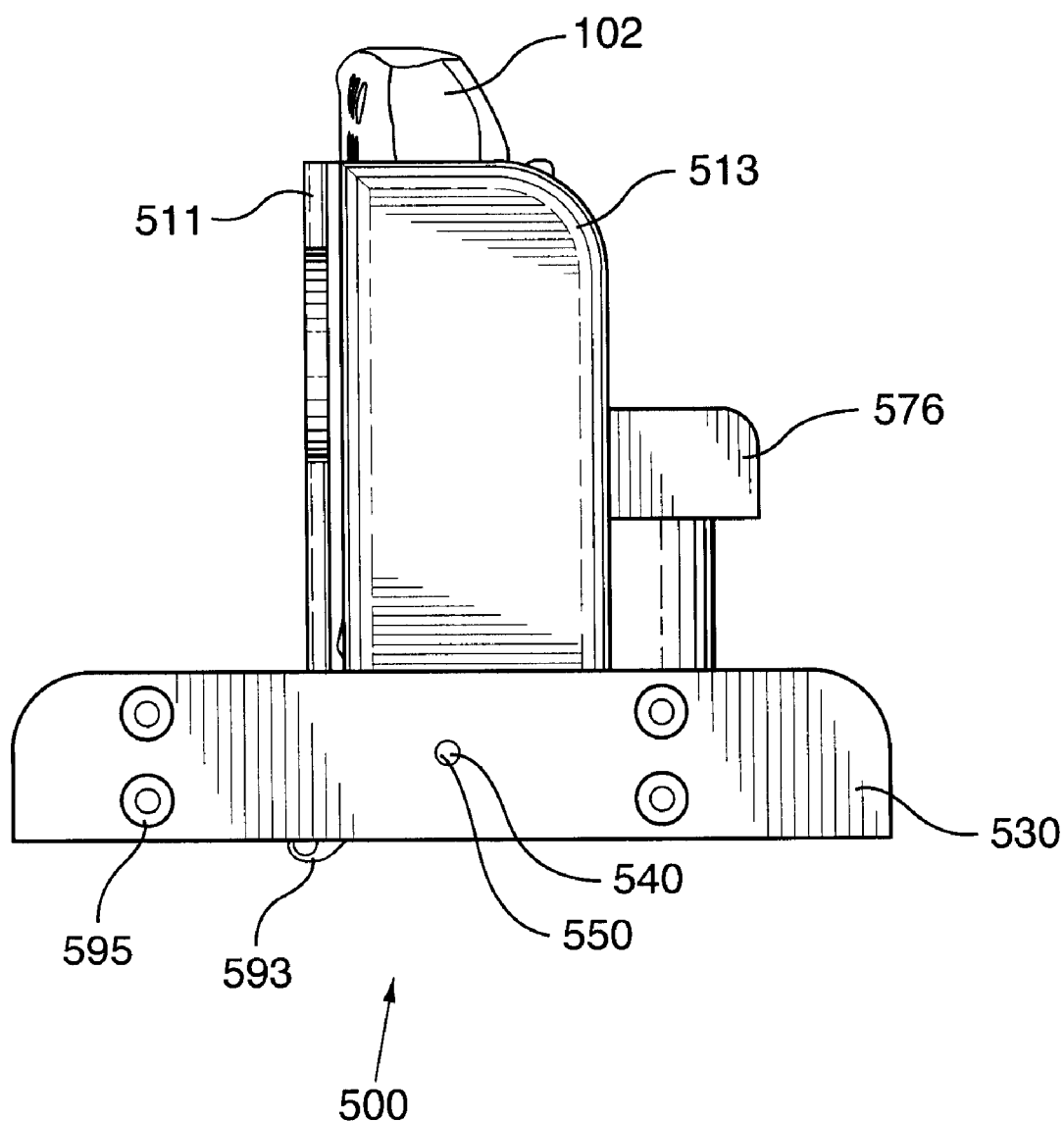
FIG. 11 is a right side view illustrating the test fixture of FIG. 4 with the wireless device installed.
Figure 12:
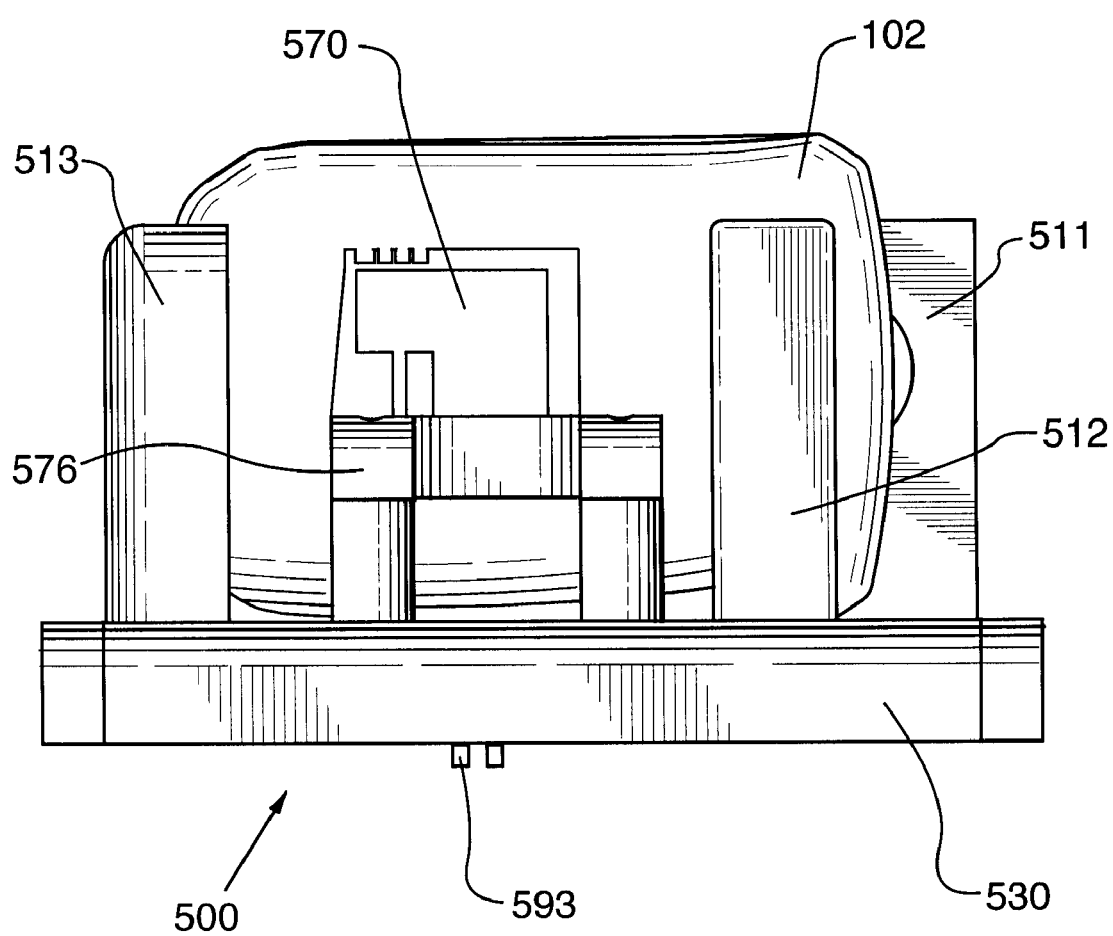
FIG. 12 is a rear view illustrating the test fixture of FIG. 4 with the wireless device installed.
Figure 13:
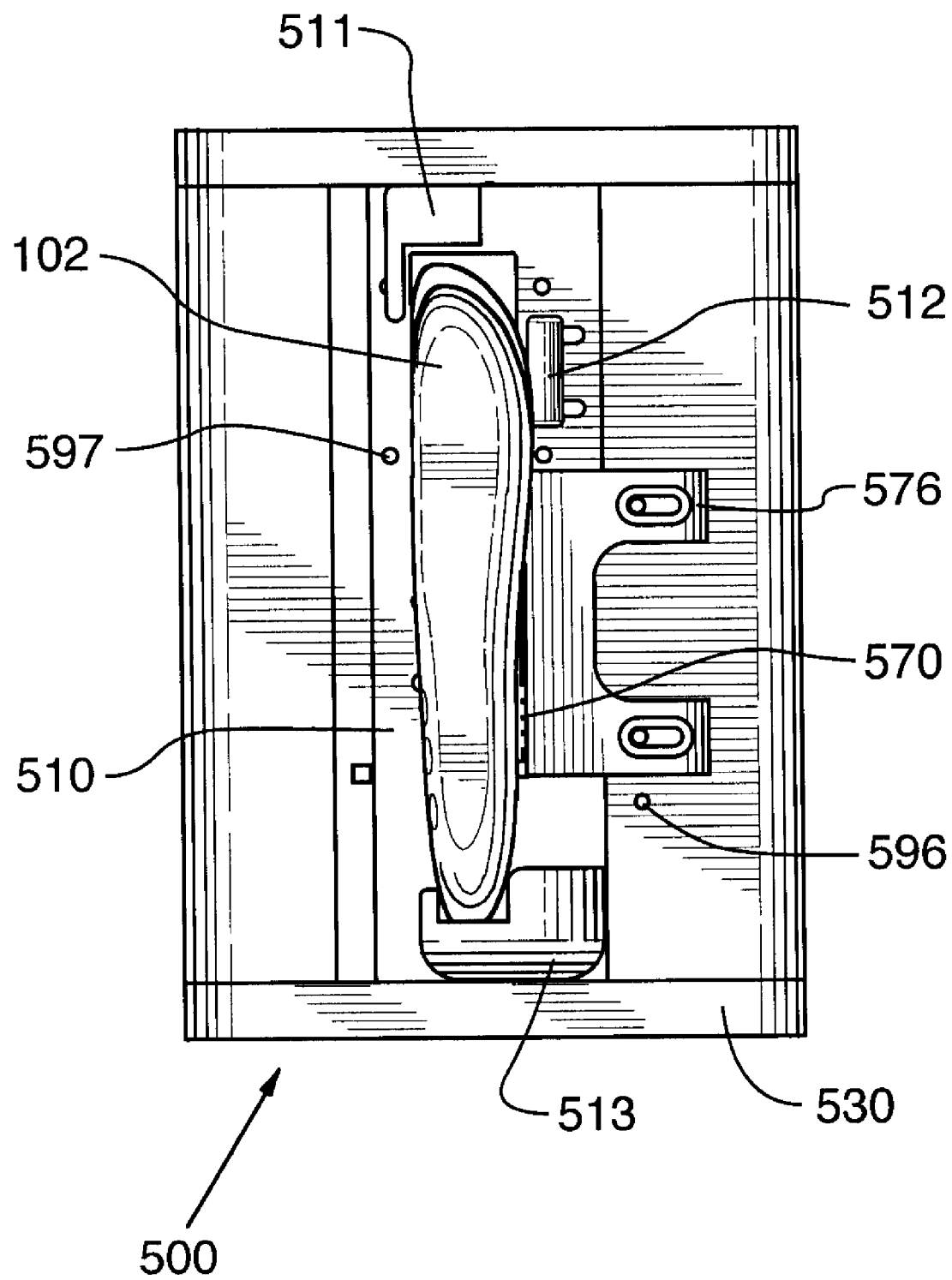
FIG. 13 is a top view illustrating the test fixture of FIG. 4 with the wireless device installed.
Figure 14:
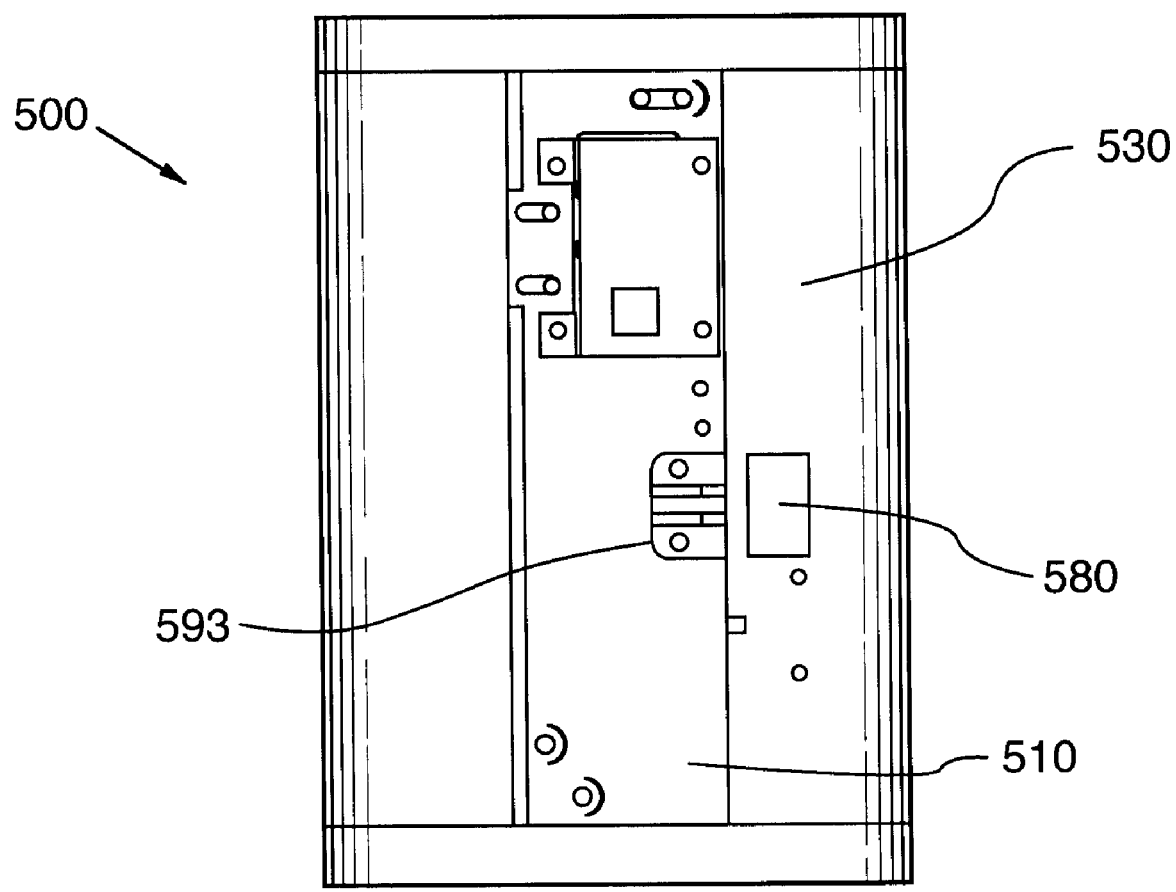
FIG. 14 is a bottom view illustrating the test fixture of FIG. 4 with the wireless device installed; and, FIG. 15 is a bottom detail view illustrating the locking mechanism of the test fixture of FIG. 4 in accordance with an embodiment of the invention.
Figure 15:
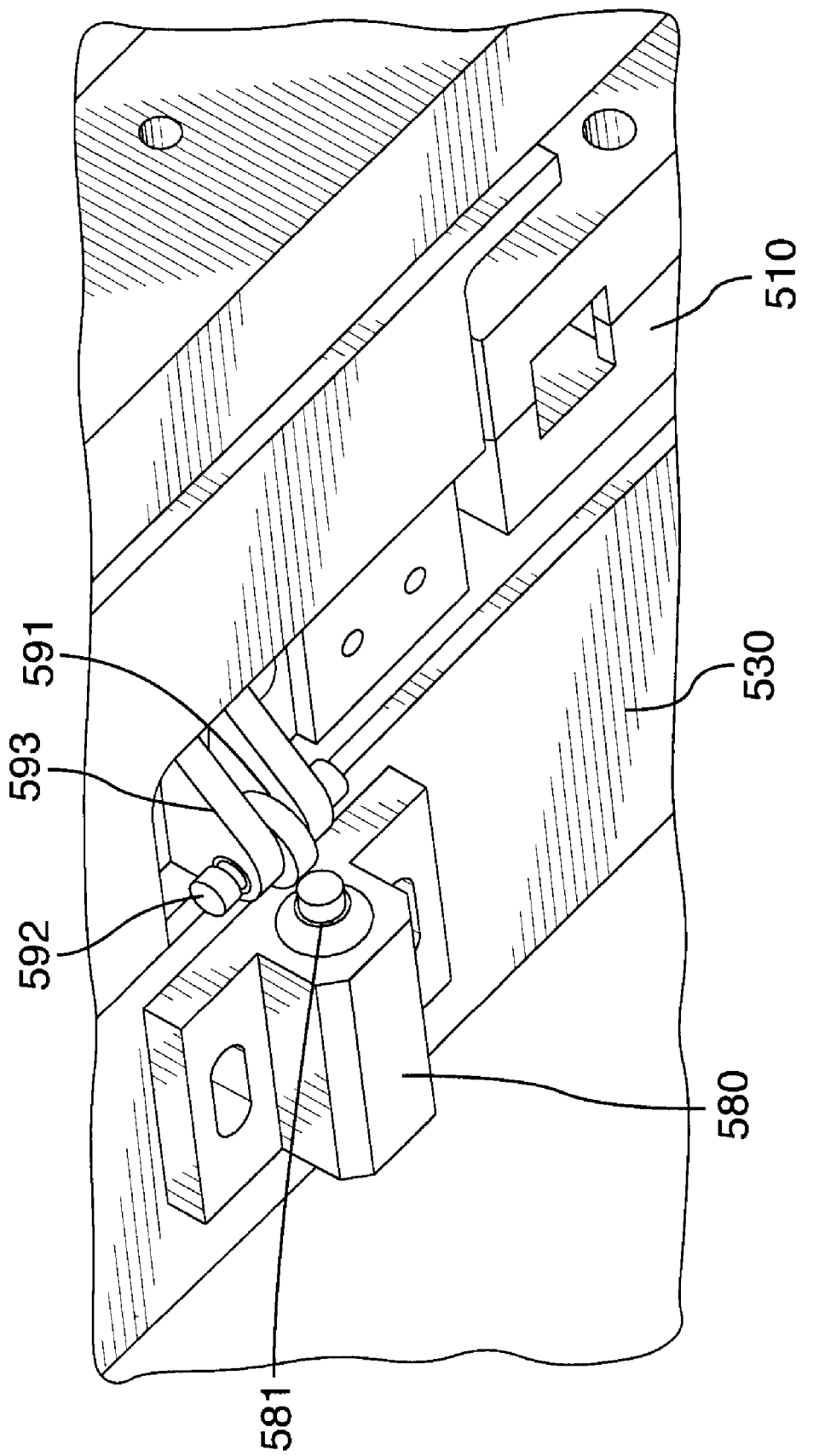

FIG. 6 is a rear perspective view illustrating the test fixture 500 of FIG. 5 with the DUT 102 installed in accordance with an embodiment of the invention. Additional views of the text fixture 500 of FIG. 5 with the DUT 102 installed are provided in FIGS. 9-15 as follows: FIG. 9 is a front view; FIG. 10 is a left side view; FIG. 11 is a right side view; FIG. 12 is a rear view; FIG. 13 is a top view; FIG. 14 is a bottom view; and, FIG. 15 is a bottom detail view.

The test fixture 500 has a retainer 510 for receiving the wireless device 102, generally after the battery 156 and battery cover 410 of the wireless device 102 are removed. As mentioned, the battery 156 may incorporate the battery cover 410. The retainer 510 has one or more adjustable elements 511, 512, 513 for engaging one or more sides of the wireless device 102 to retain the wireless device 103 in the retainer 510.

The retainer 510 includes a universal serial bus ("USB") connector 520 mounted thereon, or formed therein, for connecting to test equipment (not shown) via a cable (not shown). The USB connector 520 shown in FIG. 5 is a USB plug connector. As will be understood by those of ordinary skill in the art, the USB connector 520 may be another form of serial connector. The USB connector 520 has pin contacts (not shown) for engaging corresponding socket contacts on a mating USB receptacle connector (i.e., the serial port) 130 on the wireless device 102 when the wireless device 102 is inserted into the retainer 510. Through the USB connector 520, test signals are passed to and from the test equipment and the wireless device 102. The USB connector 520 may be mounted to the retainer 510 with some play.

The retainer 510 is rotatably mounted on a base 530. The base 530 has an opening 560 formed therein for receiving the retainer 510. The retainer 510 has a pair of axial pins 540, 541, one at either end of the retainer 510, which engage corresponding holes 550, 551 formed in the base 530. The pins 540, 541, one at either end of the retainer 510, which engage corresponding holes 550, 551 formed in the base 530. The pins 540, 541 and mating holes 550, 551 allow the retainer 510 to rotate in the opening 560 in the base 530. Alternatively, the retainer 510 may be hinge mounted on the base 530.

The fixture 500 has a battery emulator insert 570 that is rotatably mounted on the base (e.g. with pins 572, 573 and mating holes 574, 575). The battery emulator insert 570 is for emulating the function of the wireless device's battery 156 in conjunction with the external test equipment. The battery emulator insert 570 has power contacts 571 for engaging the battery contacts 154 in the battery cavity of the wireless device 102. The power contacts 571 are for providing power from the external test equipment to the wireless device 102. A spring (not shown) may be coupled between the battery emulator insert 570 and the base 530 for controlling rotation of the battery emulator insert 570. An adjustable element 576 may be mounted on the base 530 and coupled with pins 572, 573 and mating holes 574, 575 to the battery emulator insert 570 for adjusting the battery emulator insert's position.

The adjustable element 576 on the base 530 and the adjustable elements 511, 512, 513 on the retainer 510 may be repositioned to suit the wireless device 102 under test by using a number of mounting holes 596, 597 formed in the base 530 and retainer 510, respectively (see FIG. 12). the adjustable elements 511, 512, 513, 576 have formed thereon, or installed therein, pegs or pins (not shown) for mating with the mounting holes 596, 597. Of course, the adjustable elements 511, 512, 513, 576 may have various shapes and sized to suit the DUT 102.

Figure 7:
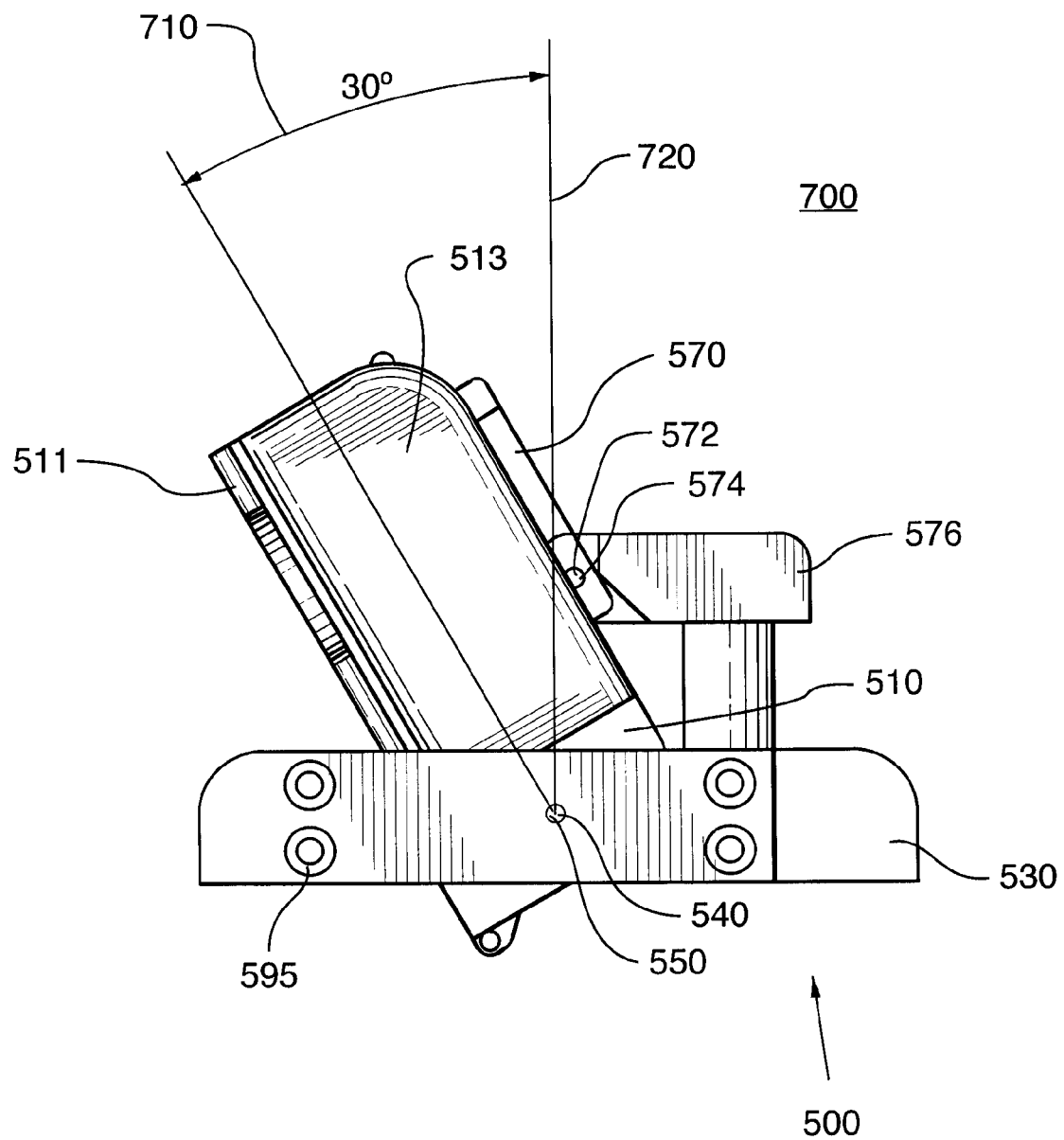
FIG. 7 is a right side view illustrating a first position for the installation of the wireless device in the text fixture in accordance with an embodiment of the invention.

In operation, the test fixture 500 uses a unique mechanical movement to first insert the USB connector 520 into the wireless device 102 and then to insert the battery emulator 570. FIG. 7 is a right side view illustrating a first position 700 for the installation of the wireless device 102 in the text fixture 500 in accordance with an embodiment of the invention. In the first position 700, the USB connector 520 of the retainer 510 is inserted into the serial port 130 of the wireless device 102. Note that in this first position 700, the retainer 510 is at an angle 710 of approximately 30 degrees from a perpendicular 720 (e.g., drawn vertically from the pin 540 and mating hole 550) of the base 530. Of course, this angle 710 may be greater or less than 30 degrees.

Figure 8:
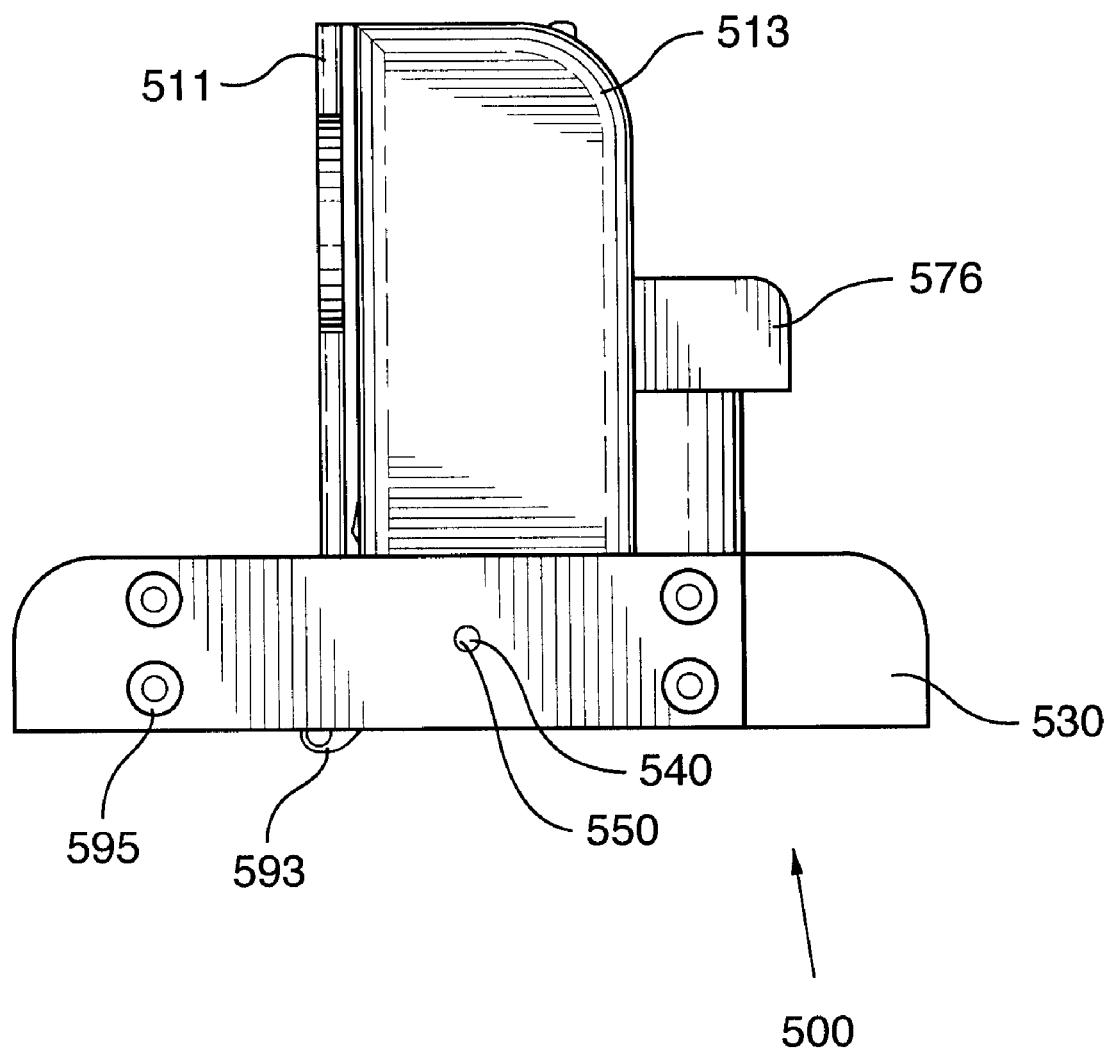
FIG. 8 is a right side view illustrating a second position for the installation of the wireless device in the text fixture in accordance with an embodiment of the invention.

FIG. 8 is a right side view illustrating a second position 800 for the installation of the wireless device 102 in the text fixture 500 in accordance with an embodiment of the invention. Once the USB connector 520 have been fully inserted into the wireless device 102, the retainer 510 is then rotated to a second upright position 800 (i.e., zero degrees from the perpendicular 720) and is locked in place. Simultaneously while the device is being rotated to the second position 800, the battery emulator insert 570 slides into the battery cavity of the wireless device 102 and is locked in place. The rotational spring of the battery emulator insert allows for its insertion into the battery cavity of the wireless device 102.

Referring to FIGS. 14 and 15, the fixture 500 has a plunger screw 581 mounted on the base 530 for engaging a ball bearing 591 mounted on the retainer 510 for locking the retainer 510 in the second position 800. The plunger screw 581 is mounted in a housing 580 fixed to the base 530. The ball bearing 591 is rotatably mounted to the retainer 510 with a pin 592 and pin retainer 593. Of course, other suitable means may be used to lock the retainer 510 in the second position.

The fixture 500 may include means (e.g., mounting holes 595, etc.) for attachment to an arm assembly of the external test equipment for manipulating the wireless device 102 during functional testing. In addition, the wireless device 102 may have stored in its memory 200 a test application 206 for directing the wireless device 102 in response to test signals received from the external test equipment through the USB connector 520.

The embodiments of the invention described above are intended to be exemplary only. The scope of the invention is therefore intended to be limited solely by the scope of the appended claims.

What is claimed is:

1. A fixture for functional testing of an assembled wireless device, the wireless device having a first port and a second port, the fixture comprising:
    a base having an opening formed therein for receiving a retainer, the retainer being rotatably mounted in the opening for rotating from a first position to a second position, the retainer for receiving the wireless device while in the first position;
    a first connector mounted in the retainer for engaging the first port of the wireless device when the wireless device is received by the retainer in the first position; and,
    a second connector rotatably mounted on the base, the second connector for engaging the second port of the wireless device when the retainer is rotated to the second position.

2. The fixture of claim 1 wherein the first port is a data port, the second port includes battery contacts housed in a battery cavity concealed by a removable casing, and the retainer receives the wireless device with the removable casing removed.

3. The fixture of claim 2, wherein the first connector is for communicating test signals with external test equipment, the second connector has power contacts for engaging the battery contacts in the battery cavity and for providing power from the external test equipment, and the removable casing is a battery pack.

4. The fixture of claim 3 and further comprising a spring coupled between the second connector and the base for controlling rotation of the second connector.

5. The fixture of claim 3 and further comprising an adjustable element mounted on the base and coupled to the second connector for adjusting the second connector's position.

6. The fixture of claim 3 and further comprising a plunger screw mounted on the base for engaging a ball bearing mounted on the retainer for locking the retainer in the second position.

7. The fixture of claim 3 and further comprising a pair of pins mounted on the retainer for engaging a mating set of holes formed in the base to allow the retainer to rotate in the opening in the base.

8. The fixture of claim 3 wherein the retainer has one or more adjustable elements for engaging one or more sides of the wireless device to retain the wireless device in the retainer.

9. The fixture of claim 3 wherein the data port is a universal serial bus ("USB") port and the first connector is a USB connector.

10. The fixture of claim 3 wherein the wireless device when received by the retainer is approximately thirty degrees from a perpendicular to the base and approximately parallel to the perpendicular to the base when the retainer is in the first and second positions, respectively.

11. The fixture of claim 3 wherein the data port and removable casing are on a side and back of the wireless device, respectively.

12. The fixture of claim 3 and further comprising means for attachment to an arm assembly of the external test equipment for manipulating the wireless device during the functional testing.

13. The fixture of claim 3 wherein the wireless device includes memory for storing a test application for directing the wireless device in response to the test signals.

14. A method for functional testing of an assembled wireless device, the wireless device having a first port and a second port, the method comprising:
    providing a fixture having: a base having an opening formed therein for receiving a retainer, the retainer being rotatably mounted in the opening for rotating from a first position to a second position, the retainer for receiving the wireless device while in the first position; a first connector mounted in the retainer for engaging the first port of the wireless device when the wireless device is received by the retainer in the first position; and a second connector rotatably mounted on the base, the second connector for engaging the second port of the wireless device when the retainer is rotated to the second position; and
    applying test signals to at least one of the first connector and the second connector.

15. The method of claim 14 wherein the first port is a data port, the second port includes battery contacts housed in a battery cavity concealed by a removable casing, and the retainer receives the wireless device with the removable casing removed.

16. The method of claim 15, wherein the first connector is for communicating test signals with external test equipment, the second connector is has power contacts for engaging the battery contacts in the battery cavity and for providing power from the external test equipment, and the removable casing is a battery pack.

17. The method of claim 16 wherein the fixture has a spring coupled between the second connector and the base for controlling rotation of the second connector.

18. The method of claim 16 wherein the fixture has an adjustable element mounted on the base and coupled to the second connector for adjusting the second connector's position.

19. The method of claim 16 wherein the fixture has a plunger screw mounted on the base for engaging a ball bearing mounted on the retainer for locking the retainer in the second position.

20. The method of claim 16 wherein the fixture has a pair of pins mounted on the retainer for engaging a mating set of holes formed in the base to allow the retainer to rotate in the opening in the base.

21. The method of claim 16 wherein the retainer has one or more adjustable elements for engaging one or more sides of the wireless device to retain the wireless device in the retainer.

22. The method of claim 16 wherein the data port is a universal serial bus ("USB") port and the first connector is a USB connector.

23. The method of claim 16 wherein the wireless device when received by the retainer is approximately thirty degrees from a perpendicular to the base and approximately parallel to the perpendicular to the base when the retainer is in the first and second positions, respectively.

24. The method of claim 16 wherein the data port and removable casing are on a side and back of the wireless device, respectively.

25. The method of claim 16 wherein the fixture has means for attachment to an arm assembly of the external test equipment for manipulating the wireless device during the functional testing.

26. The method of claim 16 wherein the wireless device includes memory for storing a test application for directing the wireless device in response to the test signals.

* * * * *